(12) United States Patent
Lee

(10) Patent No.: US 7,133,295 B2
(45) Date of Patent: Nov. 7, 2006

(54) MEMORY MODULE AND MEMORY SYSTEM

(75) Inventor: Dong-Yang Lee, Yongin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 259 days.

(21) Appl. No.: 10/405,485

(22) Filed: Apr. 3, 2003

(65) Prior Publication Data

US 2004/0047170 A1   Mar. 11, 2004

(30) Foreign Application Priority Data

Sep. 10, 2002   (KR) .................... 10-2002-0054611

(51) Int. Cl.
*H01R 12/16* (2006.01)

(52) U.S. Cl. ..................................... 361/785

(58) Field of Classification Search ........ 174/250–260; 361/784, 785, 792, 788–789
See application file for complete search history.

(56) References Cited

U.S. PATENT DOCUMENTS

| | | | |
|---|---|---|---|
| 5,383,148 A * | 1/1995 | Testa et al. .................... 365/52 |
| 5,945,886 A * | 8/1999 | Millar ............................ 333/1 |
| 6,021,048 A * | 2/2000 | Smith ......................... 361/736 |
| 6,253,266 B1 * | 6/2001 | Ohanian ...................... 710/301 |
| 6,418,034 B1 * | 7/2002 | Weber et al. ............... 361/790 |

FOREIGN PATENT DOCUMENTS

| | | |
|---|---|---|
| JP | 2125662 | 5/1990 |
| KR | 10-0302252 | 9/2001 |

OTHER PUBLICATIONS

Korean Office Action dated Sep. 22, 2004 and Translation.

* cited by examiner

*Primary Examiner*—Kamand Cuneo
*Assistant Examiner*—Yuriy Semenenko
(74) *Attorney, Agent, or Firm*—Harness, Dickey & Pierce, P.L.C.

(57) ABSTRACT

A memory module including at least one memory device mounted on a support member and at least one connect terminal mounted on the support member a distance from an edge of the support member and a memory system including the memory module are provided. The memory device may be a semiconductor device. The connect terminal may be located on at least one surface of the support member, which may be a printed circuit board. The connect terminal may be capable of connecting the memory module to a main board or to other memory modules. Further, the connect terminal may be electrically connected to the memory devices. A buffer may be mounted on the support member a distance from the edge of the support member. A main board including a base member and a second connect terminal may be connected to the memory module to form the memory system.

6 Claims, 4 Drawing Sheets

MEMORY MODULE AND MEMORY SYSTEM

CROSS REFERENCE TO RELATED APPLICATIONS

This U.S. non-provisional application claims priority under 35 U.S.C. §119 to Korean Patent Application No. 2002-54611, filed Sep. 10, 2002 in the Korean Intellectual Property Office, the contents of which are incorporated by reference in their entirety.

BACKGROUND OF THE INVENTION

1. Field of the Invention

The present invention relates generally to a memory module and a memory system, and more particularly, to a memory module that includes at least one memory device mounted on a support member and at least one connect terminal mounted on the support member a distance from an edge of the support member, and a memory system that includes the memory module.

2. Description of the Related Art

FIG. 1 is a top plan view illustrating a conventional memory module. Referring to FIG. 1, a memory module 100 includes memory devices 10_1 through 10_8, such as semiconductor memory devices, mounted substantially linearly on a circuit board 110, e.g., a printed circuit board (PCB), and contact terminals 20, which may be located at the bottom edge of the circuit board 110. "Substantially linearly" as used herein is meant to indicate a linear or close to linear orientation.

FIG. 2 is a top plan view illustrating a conventional memory module that includes a buffer 220. Referring to FIG. 2, a memory module 200 includes memory devices 110_1 through 110_8, such as semiconductor memory devices, mounted on a circuit board 210, e.g., a printed circuit board, contact terminals 20 arranged at the bottom edge of the circuit board 210, and a buffer 220. The buffer 220 and the memory devices 110_1 through 110_8 are arranged substantially linearly on the circuit board 210. The buffer 220 may buffer data input to and output from each of the memory devices 110_1 through 110_8.

When the buffer 220 is mounted on the memory module 200 and interconnected with each of the memory devices 110_1 through 110_8, the length of the interconnections between the buffer 220 and each of the memory devices 110_1 through 110_8 is different. As a result, the performance of the memory devices 110_1 through 110_8 may deteriorate. For example, when the length of the interconnections between the buffer 220 and each of the memory devices 110_1 through 110_8 is different, skew may occur in the data input to and output from the memory devices 110_1 through 110_8.

SUMMARY OF THE INVENTION

At least one exemplary embodiment of the present invention provides a memory module that includes at least one memory device mounted on a surface of a support member and at least one connect terminal mounted on the surface of the support member a distance from an edge of the support member. The memory device may be a semiconductor memory device, such as dynamic random access memory (DRAM), static random access memory (SRAM), synchronous dynamic random access memory (SDRAM), or synchronous graphics random access memory (SGRAM). The support member may be a circuit board, e.g., a printed circuit board, a printed wire board, or a flexible printed circuit tape. In addition, the memory module may include multiple layers of support members and each of the memory devices may be connected to a corresponding layer of the support members.

The connect terminal may be positioned on one or both sides of the support member. In one exemplary embodiment, the connect terminal is substantially centrally located on the support member. The connect terminal may be electrically connected to each of the memory devices. Further, the connect terminal may be positioned to connect to a second connect terminal located on a separate memory module or on a main board.

In addition, the memory module may include a buffer which may buffer signals input to and/or output from each of the memory devices. The buffer may be positioned a distance from the edge of the support member. In one exemplary embodiment, the buffer is substantially centrally located on the support member and the memory devices are positioned between the buffer and the edge of the support member. Alternatively, the buffer may be located to one side of the support member.

At least one exemplary embodiment of the present invention provides a memory system that includes a memory module and a main board. The memory module may include at least one memory device mounted on a surface of a support member and at least one first connect terminal mounted on the surface of the support member a distance from an edge of the support member. The memory device may be a semiconductor memory device, such as dynamic random access memory (DRAM), static random access memory (SRAM), synchronous dynamic random access memory (SDRAM), or synchronous graphics random access memory (SGRAM). The support member may be a circuit board, e.g., a printed circuit board, a printed wire board, or a flexible printed circuit tape. The first connect terminal may be positioned on one or both sides of the support member. In addition, the first connect terminal may be positioned a distance from an edge of the support member. The main board includes a second connect terminal mounted on a base member. The first connect terminal of the memory module may be connected to the second connect terminal of the main board.

BRIEF DESCRIPTION OF THE DRAWINGS

Exemplary embodiments of the present invention will be readily understood with reference to the following detailed description thereof provided in conjunction with the attached drawings in which.

DETAILED DESCRIPTION OF EXEMPLARY EMBODIMENTS OF THE INVENTION

Figure 1:
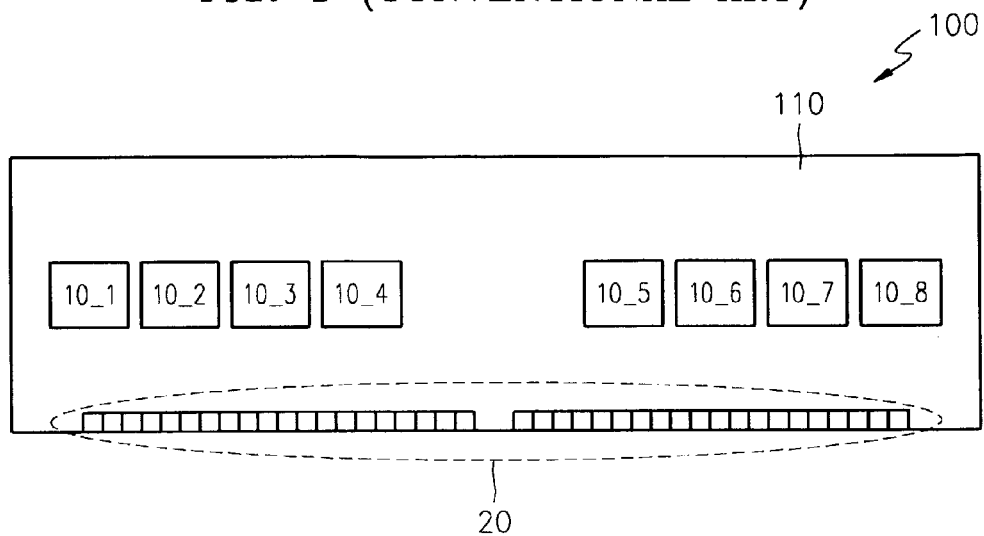
FIG. 1 is a top plan view illustrating a conventional memory module.
Figure 2:
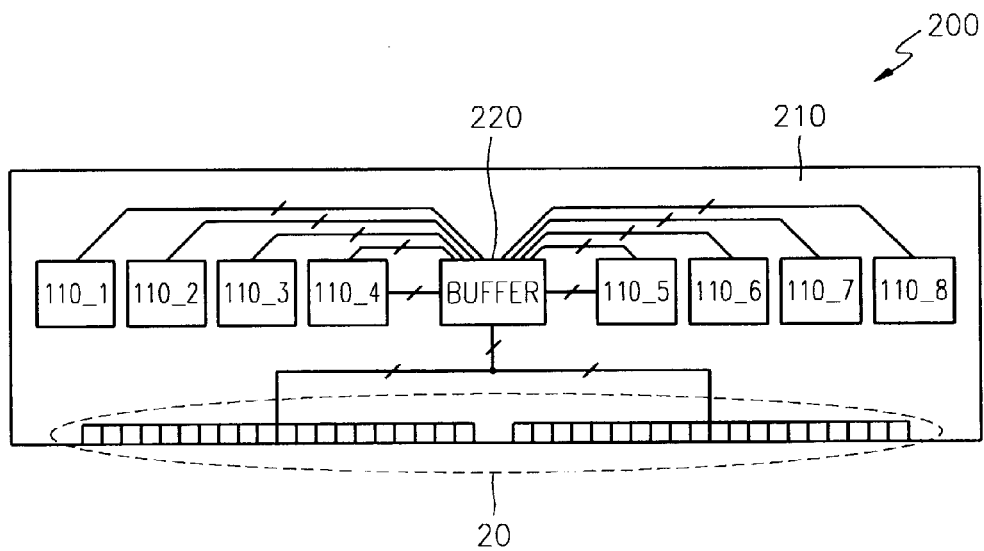
FIG. 2 is a top plan view illustrating a conventional memory module that includes a buffer.

Exemplary embodiments of the present invention will now be described more fully with reference to the accompanying drawings, in which exemplary embodiments of the invention are shown. This invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art. In the drawings, the thicknesses of layers and regions are exaggerated for clarity. It will also be understood that when an element is referred to as being "on" another element, it may be located directly on the element, or intervening elements may be present. It will be further understood that when an element is referred to as being "substantially centrally" located on an element, it may be located at the center of the element or close to the center of the element. Throughout the specification, like numbers refer to like elements.

Figure 3A:
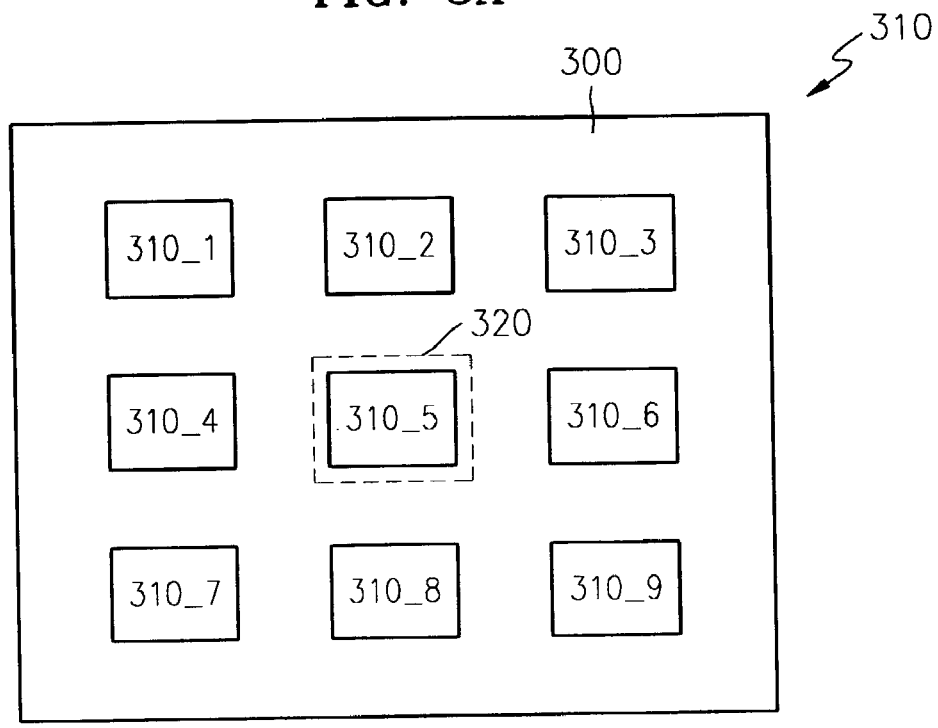
FIGS. 3A and 3B are top plan views illustrating a first surface and a second surface, respectively, of a memory module according to an exemplary embodiment of the present invention.
Figure 3B:
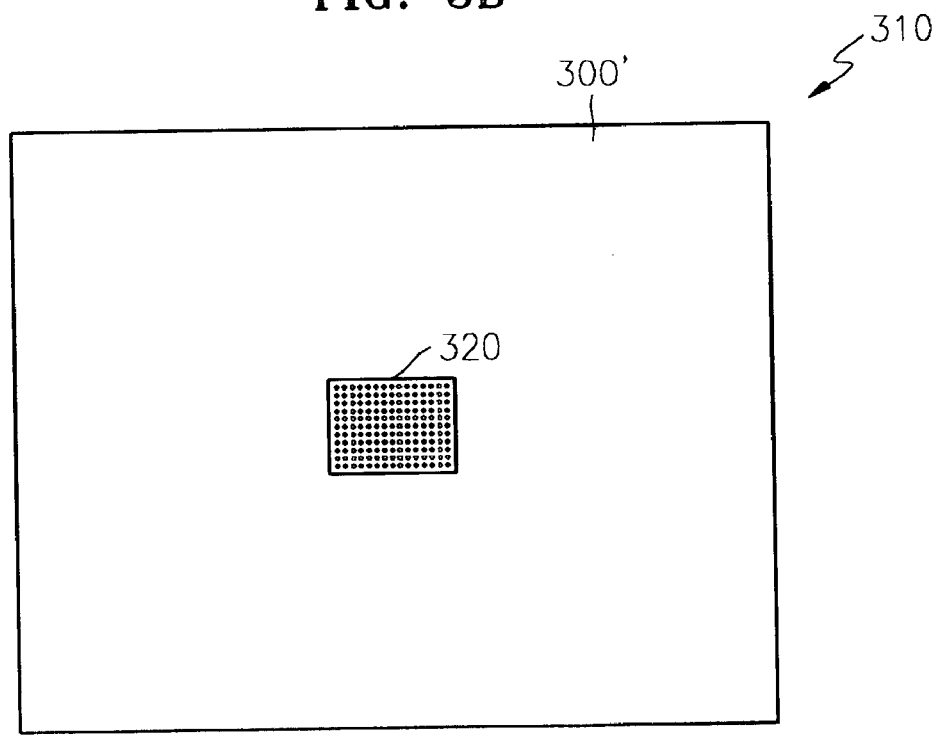

FIGS. 3A and 3B are top plan views illustrating a first surface and a second surface, respectively, of a memory module according to an exemplary embodiment of the present invention. In particular, FIG. 3A depicts a first surface 300, e.g., a front surface, of a memory module according to an exemplary embodiment of the present invention, and FIG. 3B depicts a second surface 300', e.g., a rear surface, of the memory module according to the exemplary embodiment of the present invention illustrated in FIG. 3A.

Referring to FIGS. 3A and 3B, a plurality of memory devices 310_1 through 310_9, e.g., semiconductor memory devices, such as, for example, dynamic random access memory (DRAM), static random access memory (SRAM), synchronous dynamic random access memory (SDRAM), or synchronous graphics random access memory (SGRAM) may be mounted on the first surface 300 of a support member 310. The support member 310 may be a circuit board, such as a printed circuit board (PCB), a printed wire board, or flexible printed circuit (FPC) tape. Although semiconductor memory devices are described herein as one example of the memory devices for use in the memory module, other memory devices would be easily identified by those of skill in the art. The memory module may include several layers of support members 310 and each of the memory devices 310_1 through 310_9 may be connected to a corresponding layer of the support members 310, respectively.

A connect terminal 320 may be mounted on the first surface 300 of the support member 310, the second surface 300' of the support member 310, or both the first and second surfaces 300, 300' of the support member 310 a distance from an edge of the support member 310. In one exemplary embodiment, the connect terminal 320 may be substantially centrally located on the second surface 300' of the support member 310, such as is depicted in FIG. 3B. In another exemplary embodiment, the connect terminal 320 may be located a distance from the edge of the support member 310, e.g., near the edge of the support member 310, but not touching the edge of the support member 310. Other suitable positions for the connect terminal 320 would be easily identified by those of skill in the art.

The connect terminal 320 may be electrically connected to each of the memory devices 310_1 through 310_9 and signals, for example, data and power signals, may be input to and output from the memory devices 310_1 through 310_9. The connect terminal 320 may be positioned to connect to a second connect terminal, for example, a socket (not shown), or control circuits (not shown) on a main board (see FIG. 5B). The connect terminal 320 may be a tap or a pin and a ball. In addition, the connect terminal 320 may be used to connect the memory module to another memory module or to a main board.

Figure 4A:
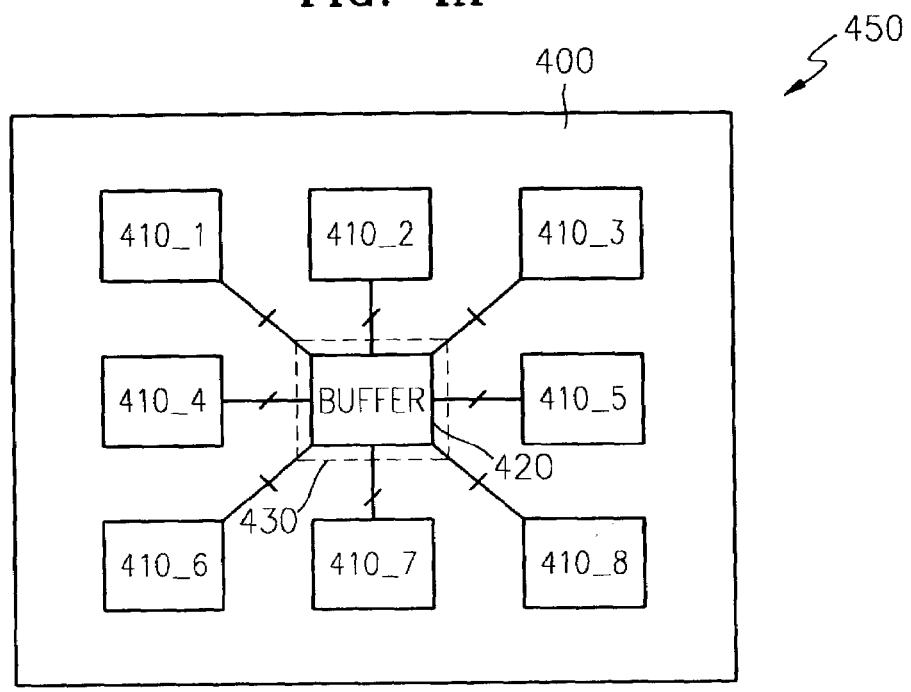
FIGS. 4A and 4B are top plan views illustrating a first surface and a second surface, respectively, of a memory module that includes a buffer according to an exemplary embodiment of the present invention.
Figure 4B:
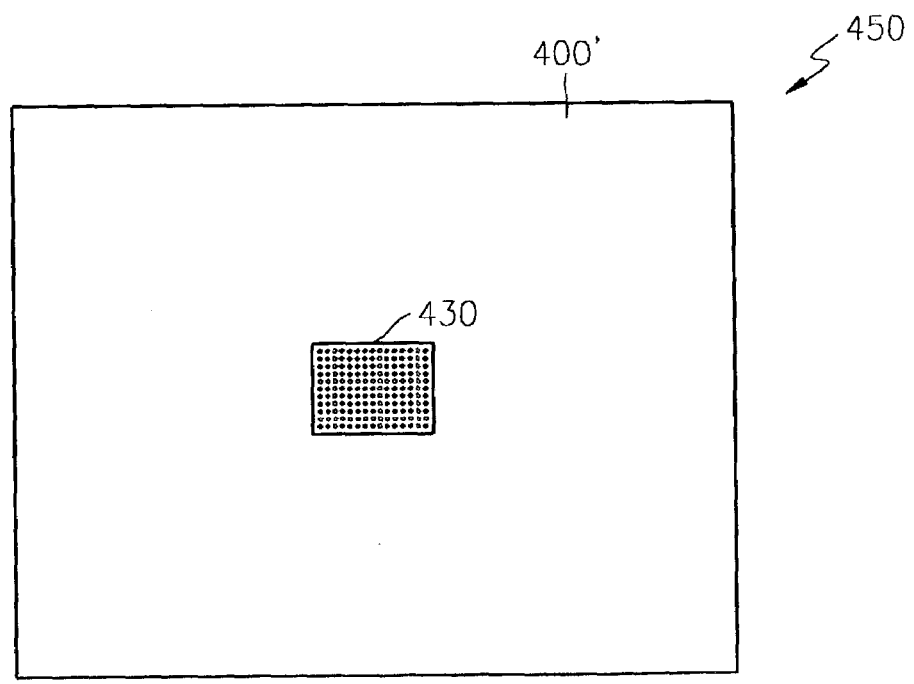

FIGS. 4A and 4B are top plan views illustrating a first surface and a second surface, respectively, of a memory module that includes a buffer according to an exemplary embodiment of the present invention. In particular, FIG. 4A illustrates a first surface 400, e.g., a front surface, of a support member 450 which includes a buffer 420, and FIG. 4B illustrates a second surface 400', e.g., a rear surface, of the support member 450 shown in FIG. 4A.

Referring to FIGS. 4A and 4B, a plurality of memory devices 410_1 through 410_8, e.g., semiconductor memory devices, and a buffer 420 are positioned on a first surface 400 of the support member 450. Suitable examples of the semiconductor memory devices may include dynamic random access memory (DRAM), static random access memory (SRAM), synchronous dynamic random access memory (SDRAM), or synchronous graphics random access memory (SGRAM). Other memory devices suitable for use in the memory module would be easily identified by one of skill in the art.

The buffer 420 may be located a distance from an edge of the support member 450. In addition, the buffer 420 may buffer signals, which are input to and/or output from each of the memory devices 410_1 through 410_8. In one exemplary embodiment, the buffer 420 is substantially centrally located on the support member 450, and the memory devices 410_1 through 410_8 may be positioned around the buffer 420 in a manner such that the memory devices 410_1 through 410_8 surround the buffer 420. By substantially centrally locating the buffer 420 on the support member 450, the distance from the buffer 420 to the memory devices 410_1 through 410_8 may be substantially equal. As a result, the occurrence of skew in the data may be reduced.

In an alternate exemplary embodiment, the buffer 420 may be located at one side of the support member 450, and the memory devices 410_1 through 410_8 may be positioned to one side of the buffer 420, or the memory devices 410_1 through 410_8 may partially surround the buffer. Other suitable placements for the buffer 420 on the support member 450 are within the purview of one of skill in the art.

A connect terminal 430 may be mounted on the first surface 400 or the second surface 400' of the support member 450, or on both the first and second surfaces 400, 400' of the support member 450. In addition, the connect terminal 430 may be positioned a distance from an edge of the support member 450. For example, the connect terminal 430 may be substantially centrally located on the support member 450. Alternatively, it may be located a distance from the edge of the support member, e.g., near the edge of the support member 450. Other suitable locations for positioning the connect terminal 430 on the support member 450 would be easily identified by one of skill in the art. The connect terminal 430 may be electrically connected to some or all of the memory devices 410_1 through 410_8 by contacting the memory devices 410_1 through 410_8 or the connect terminal 430 may be connected to some or all of the memory devices 410_1 through 410_8 via the buffer 420.

Figure 5A:
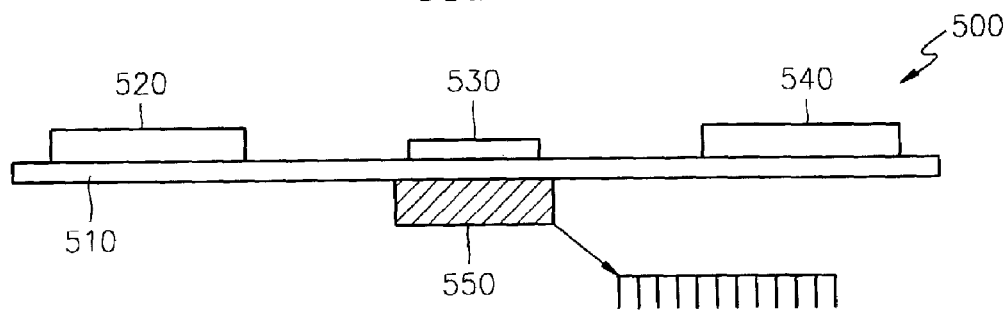
FIG. 5A is a cross-sectional view of a memory module according to an exemplary embodiment of the present invention.

FIG. 5A is a cross-sectional view illustrating a memory module according to an exemplary embodiment of the present invention. Referring to FIG. 5A, a memory module 500 may include a plurality of memory devices 520, 530, and 540, and a first connect terminal 550 positioned on a support member 510. In the exemplary embodiment depicted in FIG. 5A, the memory devices 520, 530, and 540 are positioned on a first side of the support member 510 and the first connect terminal 550 is positioned on a second side of the support member 510. The first connect terminal 550 may be located a distance from an edge of the support member 510 and may transfer data to and/or receive data from the memory devices 520, 530, and 540. In other exemplary embodiments, the first connect terminal 550 may be located on the first side of support member 510, or there may be a plurality of first connect terminals 550 positioned on one or both sides of the support member 510. The memory devices 520, 530, and 540 may be semiconductor memory devices, such as dynamic random access memory (DRAM), static random access memory (SRAM), synchronous dynamic random access memory (SDRAM), or synchronous/graphics random access memory (SGRAM). The support member 510 may be a circuit board, such as a printed circuit board (PCB), a printed wire board, or flexible printed circuit tape. Other suitable examples for the memory devices 520, 530, 540 and for the support member 510 would be easily identified by one of skill in the art.

One or more of the memory devices 520, 530, and 540 may be substituted by a buffer (not shown). In one exemplary embodiment, a buffer (not shown) may be substituted for memory device 530. The buffer may be used to buffer signals transmitted to and from the first connect terminal 550 and the memory devices 520 and 540.

Figure 5B:
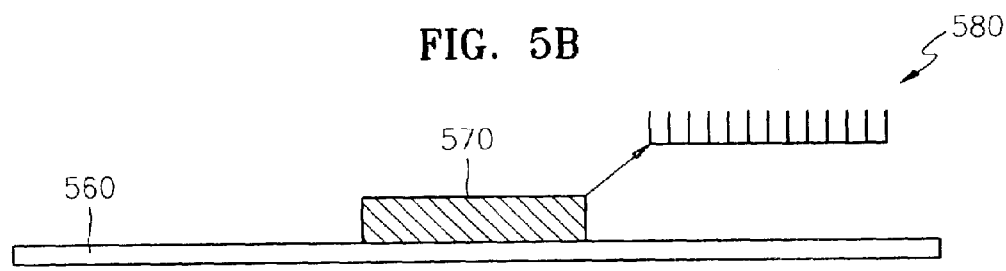
FIG. 5B is a cross-sectional view of a main board according to an exemplary embodiment of the present invention.

FIG. 5B is a cross-sectional view illustrating a main board according to one exemplary embodiment of the present invention. Referring to FIG. 5B, a main board 580 includes a base member 560 and a second connect terminal 570. Although one second connect terminal 570 is depicted in FIG. 5B, the main board 580 may include a plurality of second connect terminals 570 located on one or both sides of the base member 560. The second connect terminal 570 may be connected to the first connect terminal 550 to transfer data to and/or receive data from the first connect terminal 550.

Figure 6:
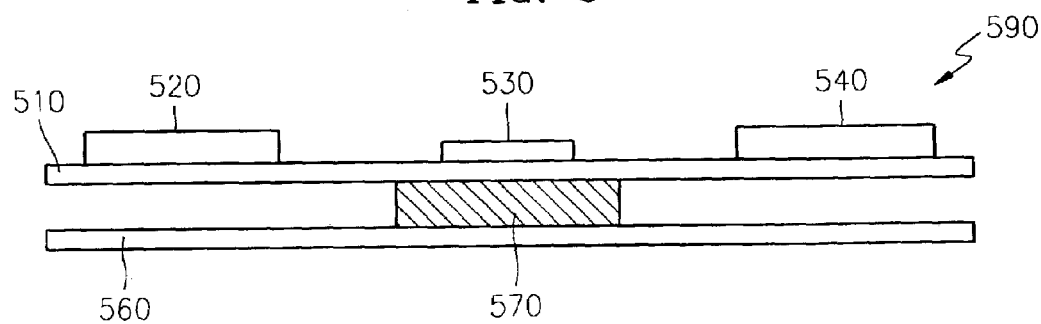
FIG. 6 is a cross-sectional view of a memory system according to an exemplary embodiment of the present invention.

FIG. 6 is a cross-sectional view illustrating a memory system according to an exemplary embodiment of the present invention in which the memory module 500 shown in FIG. 5A is connected to the main board 580 shown in FIG. 5B. In particular, the first connect terminal 550 (not shown in FIG. 6) of the memory module 500 and the second connect terminal 570 of the main board 580 are interconnected to form the memory system 590. By using the memory module 500 having a first connect terminal located substantially in the center of the support member 510, interconnection problems may be reduced and the performance of the memory system 590 may be improved.

While this invention has been particularly shown and described with reference to exemplary embodiments thereof, it should be understood by those skilled in the art that various changes in form and details may be made therein without departing from the spirit and scope of the invention as defined by the appended claims.

What is claimed is:

1. A memory module, comprising:
   a printed circuit board (PCB);
   a plurality of memory devices mounted on a first surface of the PCB; and
   connect terminals mounted on a second surface of the PCB to transfer signals to/from the outside of the memory module, the connect terminals substantially located at the center of the second surface and electrically connected to each of the plurality of memory devices.

2. The memory module of claim 1, wherein the connect terminals are connected to control circuits mounted on a main board.

3. A memory module, comprising: a printed circuit board (PCB); a plurality of memory devices mounted on a first surface of the PCB; a buffer mounted on the first surface of the PCB to buffer signals transferred to/from at least one of the plurality of memory devices, the buffer substantially located at the center of the first surface; and connect terminals mounted on a second surface of the PCB to transfer signals to/from the outside of the memory module, the connect terminals substantially located at the center of the second surface of the PCB and electrically connected to the buffer.

4. The memory module of claim 3, wherein the connect terminals are connected to control circuits mounted on a main board.

5. A memory system, comprising:
   a memory module, including
      a printed circuit board (PCB),
      a plurality of memory devices mounted on a first surface of the PCB, and
      first connect terminals mounted on a second surface of the PCB to transfer signals to/from the outside of the memory module, the first connect terminals substantially located at the center of the second surface and electrically connected to each of the plurality of memory devices; and
   second connect terminals connected to the first connect terminals.

6. A memory system, comprising: a memory module, including a buffer mounted on a first surface of a printed circuit board (PCB) to buffer signals transferred to/from a plurality of memory devices, the buffer substantially located at the center of the first surface, and first connect terminals mounted on a second surface of the PCB to transfer signals to/from the outside of the memory module, the first connect terminals substantially located at the center of the second surface of the PCB and electrically connected to each of the plurality of memory devices, and a main board including second connect terminals connected to the first connect terminals.

* * * * *